(12) United States Patent
Howell et al.

(10) Patent No.: US 6,733,348 B2
(45) Date of Patent: May 11, 2004

(54) CONTACT FOR SOCKET CONNECTOR

(75) Inventors: David G. Howell, Gilbert, AZ (US); Hsiu-Yuan Hsu, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/195,060

(22) Filed: Jul. 11, 2002

(65) Prior Publication Data

US 2004/0009715 A1 Jan. 15, 2004

(51) Int. Cl.⁷ .................................................. H01R 9/24

(52) U.S. Cl. ........................................................ 439/884

(58) Field of Search ............................. 439/70, 71, 342, 439/80, 868, 870, 871, 874, 884

(56) References Cited

U.S. PATENT DOCUMENTS 6,142,810 A * 11/2000 Hsiao et al. ................. 439/342
6,315,592 B1 * 11/2001 Keller et al. ................. 439/342
6,413,110 B2 * 7/2002 Keller ......................... 439/342

* cited by examiner

Primary Examiner—Tulsidas C Patel
(74) Attorney, Agent, or Firm—Wei Te Chung

(57) ABSTRACT

A contact (1) electrical connector includes a retention portion (11), a resilient contact portion (12), and a connecting portion (13). The resilient contact portion extends from one end of the retention portion, for electrically engaging with a mating pin contact (2). The connecting portion extends from an opposite end of the retention portion, for electrically connecting with a printed circuit board. The resilient contact portion defines an opening (122) therein. The mating pin contact engages with and deflects the resilient contact portion, and the opening receives a tip of the mating pin contact.

6 Claims, 2 Drawing Sheets

CONTACT FOR SOCKET CONNECTOR

BACKGROUND OF THE INVENTION

1. Field of the Invention

The present invention relates to a contact for an electrical connector, and more particularly to a contact for a socket connector such as a central processing unit (CPU) socket connector.

2. Description of the Prior Art

Conventionally, a contact for a CPU socket comprises a retention portion for securing the contact in a corresponding passageway of the CPU socket. A resilient contact portion extends from one end of the retention portion, for electrically engaging with a mating pin of a CPU. A connecting portion extends from an opposite end of the retention portion, for electrically connecting with a printed circuit board (PCB). U.S. Pat. No. 6,142,810 discloses a contact for a CPU socket. Referring to FIG. 4, the contact 3 comprises a retention portion 32, a mounting pad 34 extending from a bottom end of the retention portion 32, and an engaging portion 31 extending from a top end of the retention portion 32. The engaging portion 31 comprises a pair of cantilevers 311 which extend a predetermined distance in one direction and converge toward each other. The cantilevers 311 clamp and apply mating force against a CPU pin (not shown), to ensure reliable engagement between the CPU pin and the engaging portion 31. It can be seen that the contact 3 has a relatively complex configuration. Therefore, it is unduly difficult to punch a metal strip to form the contact 3 during manufacturing. In addition, the configuration of the engaging portion 31 means that a length of metal strip required for punching each contact 3 is unduly great. Thus too much of the metal strip is wasted when each contact 3 is punched. This inflates the cost of materials and production costs. U.S. Pat. Nos. 3,676,832 and 6,142,811 disclose conventional CPU socket contacts which have similar disadvantages.

FIG. 5 shows a CPU socket contact 24 as disclosed in U.S. Pat. No. 4,498,725. The contact 24 comprises two parallel, vertical arms 106, 108 connected by a transverse channel-strap 110. A pair of fingers 118 extends from respective upper ends 116 of the arms 106, 108. Converging portions 120 of the fingers 118 converge toward each other. Free ends, 122 of the fingers 118 extend from the converging portions 120. The free ends 122 are parallel to each other, and are spaced apart by a distance that is less than a minimum diameter of a mating contact of a CPU. The arms 106, 108 and the fingers 118 together have a profile resembling the numeral seven. It can be seen that the structure of the contact 24 is relatively complex. This makes the contact 24 difficult to manufacture, and inflates the cost of materials and production costs. Moreover, the complex structure of the contact 24 results in unduly high impedance thereof. Therefore heat generated during signal transmission between the CPU and the PCB can reach excessively high levels, and can harm the CPU. A similar CPU socket contact disclosed in the U.S. Pat. No. 5,649,836 has similar disadvantages.

In view of the above, a new CPU socket contact that overcomes the above-mentioned disadvantages is desired.

SUMMARY OF THE INVENTION

An object of the present invention is to provide an electrical contact for use in an electrical connector such as a CPU socket, wherein the electrical contact has a simple structure and improves electrical connection between a CPU and a PCB.

To achieve the above object, a contact for an electrical connector is provided by the present invention. The contact comprises a retention portion, a resilient contact portion, and a connecting portion. The resilient contact portion extends from one end of the retention portion, for electrically engaging with a mating pin contact. The connecting portion extends from an opposite end of the retention portion, for electrically connecting with a PCB. The resilient contact portion defines an opening therein. The mating pin contact engages with and deflects the resilient contact portion, and the opening receives a tip of the mating pin contact.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Reference will now be made to the drawings to describe the present invention in detail.

Figure 1:
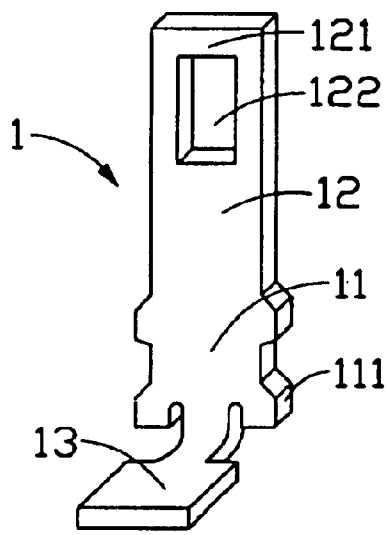
FIG. 1 is an isometric view of a contact in accordance with the present invention.
Figure 2:
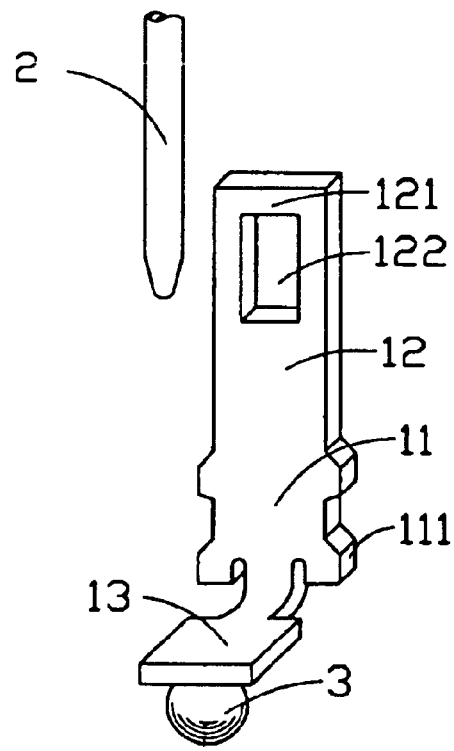
FIG. 2 is an isometric view of the contact of FIG. 1 together with a solder ball attached thereto, and a mating pin of a CPU prior to engagement of the mating pin with the contact.

Referring to FIGS. 1 and 2, an electrical contact 1 in accordance with a preferred embodiment of the present invention comprises a retention portion 11, an elongate resilient contact portion 12 extending from one end of the retention portion 11, and a connecting portion 13 extending from an opposite end of the retention portion 11. The retention portion 11 and the resilient contact portion 12 are substantially coplanar with each other. The retention portion 11 forms a multiplicity of barbs 111 at opposite lateral sides thereof, for interferentially securing the contact 1 in a corresponding passageway of a CPU socket (not shown). The resilient contact portion 12 comprises a distal engagement portion 121, and an opening 122 defined adjacent the engagement portion 121. The connecting portion 13 can be soldered to a PCB (not shown) via a solder ball 3. The resilient contact portion 12 is resilient enough to facilitate resilient engagement between the engagement portion 121 and a mating pin 2 of a CPU, as described below.

Figure 3:
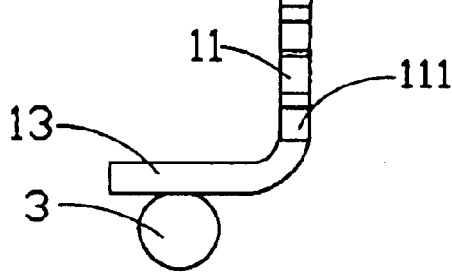
FIG. 3 is a schematic side view of the components of FIG. 2, but showing the mating pin engaged with the contact.
Figure 4:
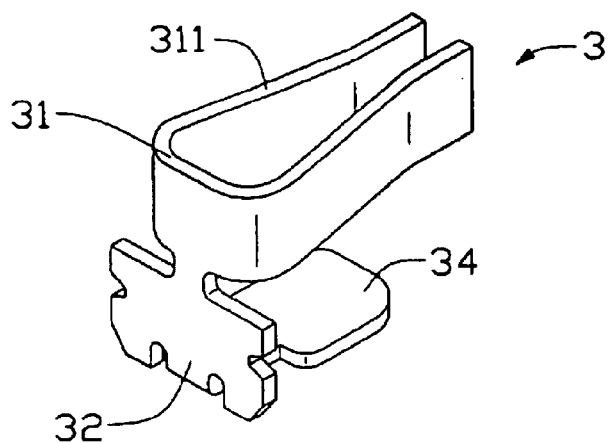
FIG. 4 is an isometric view of a conventional contact.
Figure 5:
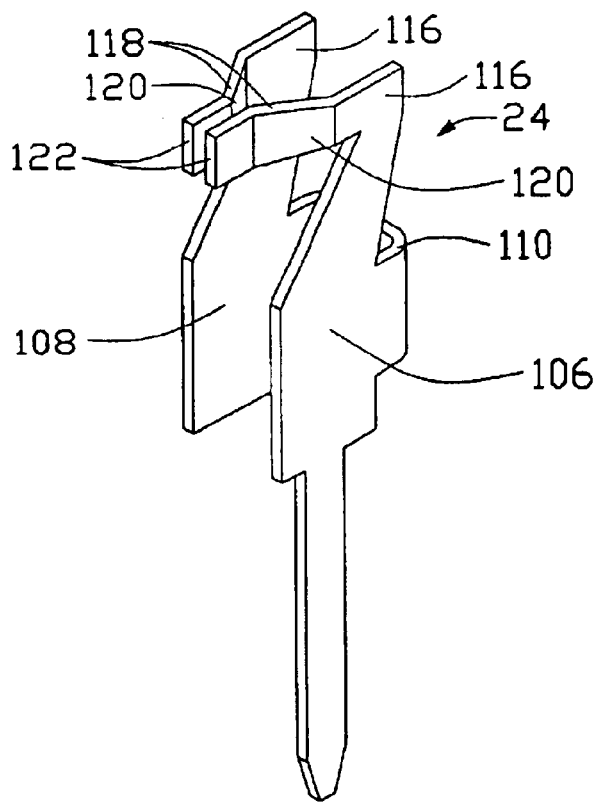
FIG. 5 is an isometric view of another conventional contact.

Referring to FIG. 3, the pin 2 is actuated to abut against the resilient contact portion 12 at an upper extremity of the opening 122. The resilient contact portion 12 deforms to ensure enough mating force and reliable engagement between the pin 2 and the resilient contact portion 12. The opening 122 of the contact 1 receives a tip of the pin 2, to prevent the tip from scraping a main face of the resilient contact portion 12. Accordingly, the contact 1 is prevented from being damaged by the pin 2. In addition, the opening 122 can reduce deformation of the contact portion 12 when the pin 2 abut against the engagement portion 121 during mating. Thus the number of mating cycles of the contact 1 is increased. Furthermore, the configuration of the contact 1 is simple, therefore lowering the cost of materials and manufacturing costs. Due to the simple configuration of the contact 1, impedance of the contact 1 is low. Thus heat generated during the signal transmission is low. Reliable and durable electrical connection between the contact 1 and the pin 2 is attained.

In alternative embodiments of the present invention, the resilient contact portion 12 may have a variety of different shapes. For example, the resilient contact portion 12 may be triangular or disc-shaped.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A contact for an electrical connector, the contact comprising:
   a retention portion;
   a resilient contact portion extending generally coplanarly from the retention portion and being adapted to engage with a mating contact; and
   a connecting portion extending from the retention portion and being adapted to electrically connect with a circuit board;
   wherein the resilient contact portion defines an engaging portion at a top thereof and an opening adjacent said engaging portion for receiving the mating contact when the mating contact resiliently engages with said engaging portion.

2. The contact of claim 1, wherein a plurality of barbs Is formed on opposite lateral sides of the retention portion, for interferentially engaging in a corresponding passageway of a connector socket.

3. A contact for an electrical connector, the contact comprising:
   a retention portion;
   a resilient contact portion deflectably connected to the retention portion, the resilient contact portion defining an opening therein, and being adapted to engage with a mating contact; and
   a connecting portion extending from the retention portion and being adapted to electrically connect with a circuit board;
   wherein the retention portion and the resilient contact portion are substantially coplanar with each other prior to engagement of mating contact with the resilient contact portion, and the resilient contact portion deflects upon engagement with the mating contact such that the opening receives the mating contact.

4. The contact of claim 3, wherein the resilient contact portion defines an engagement portion at a top distal end thereof and adjacent the opening.

5. The contact of claim 3, wherein a plurality of barbs Is formed on opposite lateral sides of the retention portion, for interferentially engaging in a corresponding passageway of a connector socket.

6. A contact assembly comprising:
   a first contact defining a plato-like vertical resilient contact portion and a mounting portion at a bottom portion of the contact portion;
   a vertical opening located in a top portion of the contact portion; and
   a rigid pin type second contact adapted to mate with said first contact;
   wherein while said second contact normally approaches the contact portion of said first contact and furthermore engages and deflects the contact portion, a distal end of the second contact is substantially located around the opening with a bottom portion of said second contact being engaged with an edge of the opening, said second contact extends into the opening only after the contact portion of the first contact is deflected by the second contact.

* * * * *